(12) United States Patent
Takada et al.

(10) Patent No.: US 7,088,019 B2
(45) Date of Patent: Aug. 8, 2006

(54) AIR BEARING FOR MEMS BASED MOTOR

(75) Inventors: Akio Takada, Singapore (SG); Ching Biing Yeo, Singapore (SG); Cheow Tong Cheng, Singapore (SG); Shun Kayama, Ageo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/730,472

(22) Filed: Dec. 8, 2003

(65) Prior Publication Data
US 2004/0119354 A1 Jun. 24, 2004

(30) Foreign Application Priority Data
Dec. 10, 2002 (SG) .............................. 200207479-7

(51) Int. Cl.
*H02K 7/08* (2006.01)
(52) U.S. Cl. ............ 310/40 MM; 310/90; 310/156.32; 384/114
(58) Field of Classification Search ......... 310/40 MM, 310/90, 309, 156.32; 384/114, 371, 397; 360/99.08
See application file for complete search history.

(56) References Cited

U.S. PATENT DOCUMENTS

| | | | | |
|---|---|---|---|---|
| 4,943,750 A | | 7/1990 | Howe et al. ................ 156/651 |
| 4,997,521 A | | 3/1991 | Howe et al. ................ 310/309 |
| 5,173,797 A | * | 12/1992 | Zedekar et al. ............. 359/212 |
| 5,510,299 A | | 4/1996 | Li et al. ...................... 437/225 |
| 5,746,515 A | * | 5/1998 | Takahashi et al. .......... 384/115 |
| 5,907,456 A | * | 5/1999 | Khan et al. ............... 360/99.08 |
| 6,430,001 B1 | * | 8/2002 | Chainer et al. .......... 360/99.08 |
| 6,615,681 B1 | | 9/2003 | Jenkins et al. .............. 74/5.46 |
| 6,674,200 B1 | * | 1/2004 | Tokunaga ..................... 310/90 |
| 2002/0048416 A1 | | 4/2002 | Binnig et al. ................. 384/12 |
| 2002/0096018 A1 | | 7/2002 | Rodgers et al. ............. 81/3.33 |
| 2004/0119354 A1 | * | 6/2004 | Takada et al. ................. 310/90 |
| 2005/0035671 A1 | * | 2/2005 | Takada et al. ........ 310/40 MM |
| 2005/0036234 A1 | * | 2/2005 | Takada et al. ........... 360/98.07 |

FOREIGN PATENT DOCUMENTS

JP 06-021532 * 1/1994

OTHER PUBLICATIONS

Translation of 6-21532 by kusagi "microscopic rotation mechanism", Jan. 1994.*

* cited by examiner

*Primary Examiner*—Karl Tamai
(74) *Attorney, Agent, or Firm*—Frommer Lawrence & Haug LLP; William S. Frommer

(57) ABSTRACT

A MEMS (micro-electromechanical system) device having a rotor 44, a stator 43 and a shaft 27 connected to the stator 43 and around which the rotor 44 rotates. Grooves 47 are formed in a portion of the rotor 44, such that when the rotor 44 rotates an air bearing is formed for supporting the rotor 44 and maintaining its distance from the shaft 27 and stator 43. The rotor 44 is formed from joining two substrates 13, 23. One of the substrates 13 includes a surface having openings 7 including frustoconical walls, and one of the substrates 23 includes a surface having openings 15 including walls perpendicular to the surface of the substrate. The openings in the two substrates are in register with each other so that pairs of the openings form chambers 24. Each chamber 24 is provided with a shaft 27, which is positioned with a wide section of the shaft trapped in the chamber 24. The wide section of the shaft has a frustoconical surface facing the frustoconical walls of the chamber 24.

5 Claims, 14 Drawing Sheets

AIR BEARING FOR MEMS BASED MOTOR

FIELD OF THE INVENTION

The present invention relates to a motor which can be constructed using MEMS (micro-electromechanical systems) technology, and to a method of constructing the motor.

BACKGROUND OF INVENTION

Recently there has been much research to develop MEMS devices, that is mechanical devices having dimensions of micrometers (for example, having a maximum diameter no more than say 10 millimetres). Some such devices include an element which rotates around a shaft attached to a stator. One such device is shown in cross-section in FIG. 1, and includes a rotor 101. A through aperture 103 is formed in the rotor 101, and a shaft 102 is then inserted into the aperture. The shaft 102 is connected to a stator 104 which carries copper windings 105. The rotor 101 includes cavities which are filled with a metal yoke layer 106 and thicker magnetic layer 107.

In such a system a contact bearing is not suitable, and to minimise contact resistance it is preferable that the shaft 102 has a wide clearance from the sides of the aperture 103. However, a small clearance is required in order to avoid eccentricity in the rotation of the shaft 102. As a consequence, the contact surfaces at which the moving parts touch each other experience frictional resistance, and are liable to abrasion.

SUMMARY OF THE INVENTION

The present invention aims to provide a new and useful MEMS device, and a new and useful method for fabricating MEMS devices.

In general terms, the present invention proposes that at least one surface of the MEMS device is provided with grooves for generating an air bearing between the rotor and the shaft and/or stator as the rotor rotates.

Conveniently, the grooves may be formed on a surface of the stator which faces a surface of the rotor, or a surface of the rotor which faces the stator. The grooves may generate an air current through the gap between the rotor and the shaft.

In a first case, the air bearing can be between the rotor and the stator, and can support at least a proportion of the weight of the rotor.

In a second case, which is freely combinable with the first, the air bearing can be between the rotor and the shaft.

For example, the air bearing may be positioned between the shaft and the stator to generate a force having a component in the rotational plane (i.e. the plane perpendicular to the axis of the shaft) which, in the case that the central axis of the aperture of the rotor moves away from the axis of the shaft, urges the rotor to move so that the axis of the aperture returns to coincide with the axis of the shaft.

Advantageously, the shaft and stator are co-operatively shaped such that the gap between them includes a plurality of circumferentially spaced constrictions. At each of these constrictions the air has a higher pressure and tends to push the rotor and the shaft apart. When the rotor is correctly centred on the axis of the shaft, the respective forces from the constrictions balance, but when the rotor is displaced from the axis of the shaft so as to narrow one or more of the constrictions and widen the other(s), the air pressure at the narrowed constriction(s) grows and the air pressure at the widened constriction fall(s), so that a force is generated to urge the rotor back to the correct position.

In a second example of the air bearing being formed between the rotor and the shaft, the shaft may be formed to include a first surface which is at least partially upwardly facing (when the MEMS device is in use), and in this case the air bearing may be formed between that first surface of the shaft and a second at least partially downwardly-facing surface of the rotor. The air bearing at least partly supports the weight of the rotor.

In principle, the first surface of the shaft and the opposing second surface of the rotor could each be planar and perpendicular to the rotational axis. However, the inventors have found that it is advantageous if both of these surfaces are conical (or, more exactly, frustoconical), since in this case the air flow between the rotor and the shaft is smoother.

In a preferred case, the rotor is formed with a chamber which includes a conical surface, and the shaft is not of uniform thickness along its axis but rather includes a wide portion located within the chamber and including a conical surface facing the conical surface of the substrate.

The invention can also be expressed as a method of forming an MEMS device which includes forming grooves in it to generate an air bearing upon the rotor rotating.

The method may include forming corresponding openings in two substrates, and joining the substrates together with the corresponding openings facing each other and sandwiching a wide portion of respective shafts, and cutting the joined substrates to form rotors encircling the respective shafts.

BRIEF DESCRIPTION OF THE FIGURES

Preferred features of the invention will now be described, for the sake of illustration only, with reference to the following figures in which.

DETAILED DESCRIPTION OF THE EMBODIMENTS

The steps of constructing a MEMS device which is a first embodiment of the invention will now be described.

Figure 1:
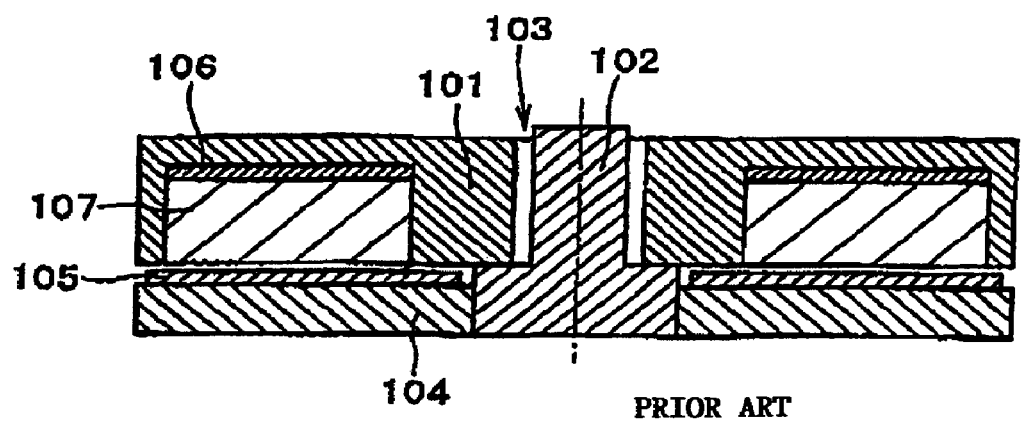
FIG. 1 is a cross-sectional view of a known MEMS device.
Figure 2:
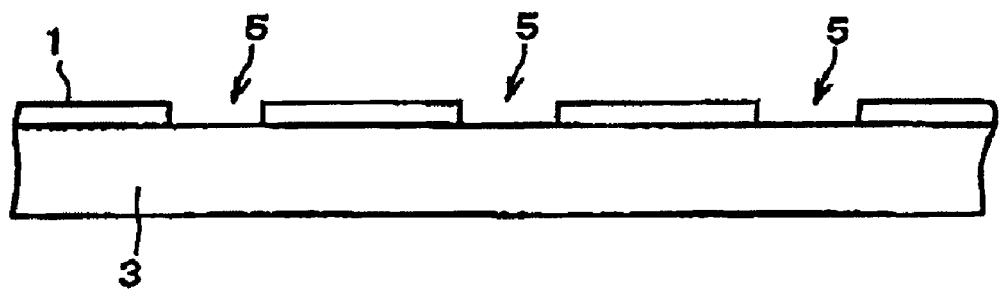
FIG. 2 is a cross-sectional view of a coated substrate formed in a first step of a method which is an embodiment of the invention.
Figure 3:
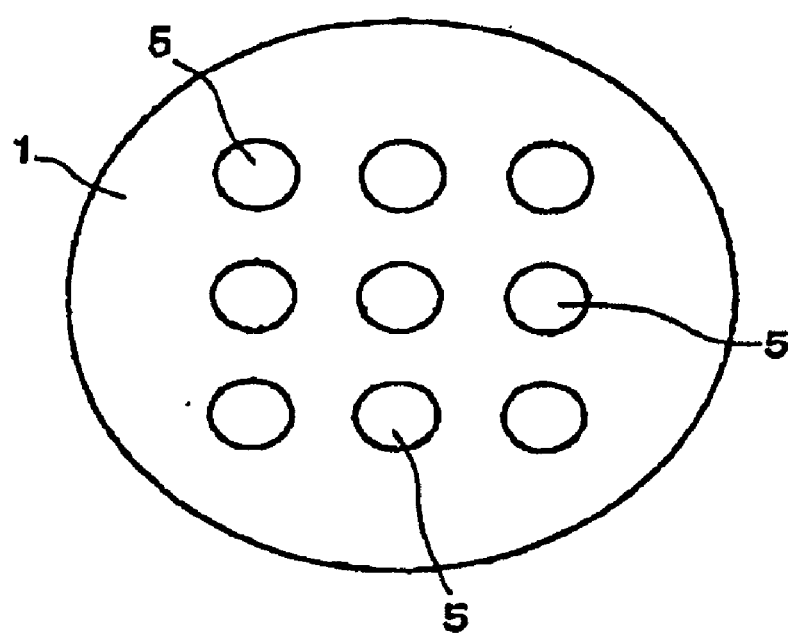
FIG. 3 is a top view of the coated substrate shown in FIG. 2.

Referring firstly to FIG. 2, a thin layer 1 of protective masking material is formed by spin-coating on the surface of a substrate 3, which may be composed of silicon (Si), or glass ($SiO_2$). Multiple circular openings 5 are formed in the layer 1 by conventional lithography in an array. FIG. 3 is a top view of the coated substrate.

Two coated substrates as shown in FIGS. 2 and 3 are produced, and the coated substrates 3 are treated in different respective ways. The substrates 3 are given the reference numerals 13 and 23 respectively.

Figure 4A:
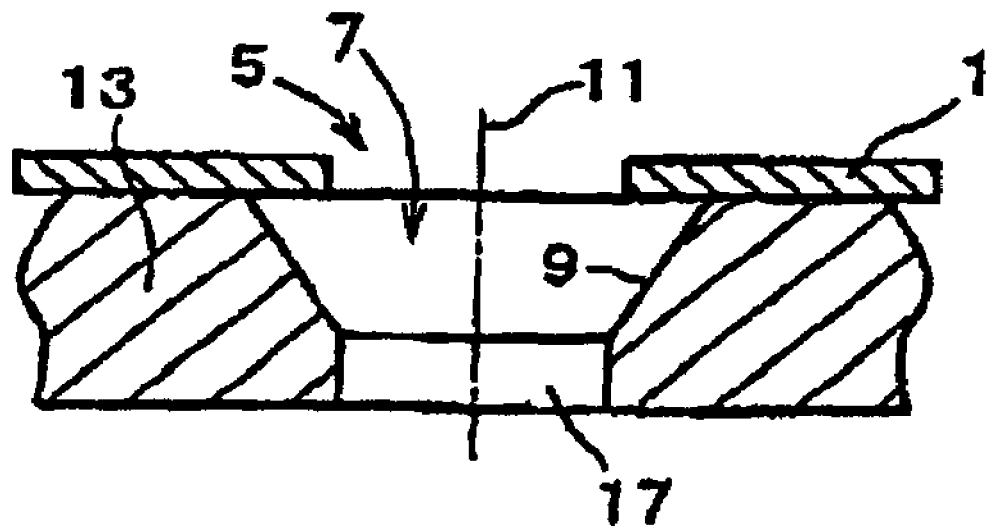
FIG. 4(a) is a cross section of a first substrate that can be produced from the substrate of FIG. 2.

A first way of treating the coated substrate is wet chemical etching on surface of the substrate 13 carrying the layer 1. The coated substrate is dipped into an etchant solution, and a chemical reaction occurs on the unmasked areas of the substrate 13 and corrodes into the substrate material. The liquid etchant being typically isotropic causes corrosion to spread around the unmasked portion to form undercuts under the layer 1. This produces a structure as shown in FIG. 4(a), in which openings 7 are formed with tapered sides 9. These openings 7 are circularly symmetric about respective axes 11 perpendicular to the surface of the substrate 3, so that the tapered sides 9 are frusto-conical.

Figure 4B:
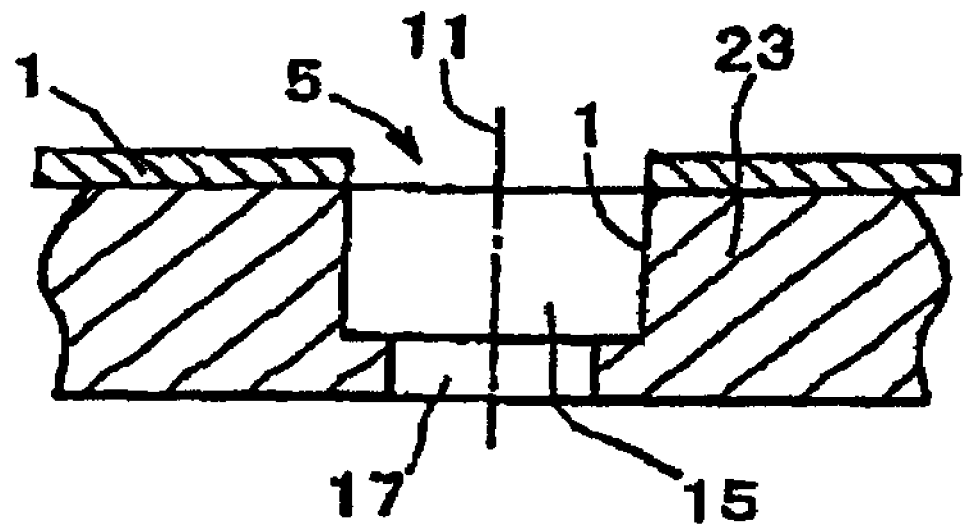
FIG. 4(b) is a cross section of a substrate of a second substrate that can be produced from the substrate of FIG. 2.

A second way of treating the coated substrate is dry plasma etching of the substrate 23, in which etchant gas is released and used to form plasma ions which are accelerated by a high electrical potential toward the coated surface of the substrate 23, causing rapid corrosion. Since the ions travel straight towards the substrate, openings 13 are formed with cylindrical walls 13, as shown in FIG. 4(b).

Note, however, that it would be possible to provide a tapered profile as shown in FIG. 4(a) by plasma etching if the cross-sectional profile of the masking layer 1 is formed so as to be sloped at its end. This can be done, for example, by extended heat curing. In this case, the portion of the layer 1 having reduced thickness will provide less masking, and so permit a degree of etching of the substrate below it which is dependent upon the thickness of the masking layer 1. In other words, an opening would be produced with a degree of corrosion at any point which is related to the thickness of the masking layer at that point.

In each of the methods described above, the openings 7, 15 are formed to extend through approximately half the thickness of the substrates 13, 23. Following that, etching methods are employed on the opposite surfaces of the substrates 13, 23 (the lower surface as shown in FIG. 2) to produce cylindrical openings 17. Thus, through holes are formed in the substrates 3 as shown in FIGS. 4(a) and (b). The layer 1 is then removed.

A coating film (labelled 19 in the FIG. 5) is then deposited on the interior surface of the openings 7, 15, 17 on both of the substrates shown in FIGS. 4(a) and (b). The layer 19 is formed from a hard material such as diamond-like-carbon (DLC). As discussed later, the openings 7, 15, 17 will subsequently be used to form a sleeve for the shaft of the stator, and in this case the film 19 provides a lubricating effect due to its high hardness property. The film 19 can be formed by a deposition technique, such as a sputtering or chemical vaporization method. The required uniform film thickness can be achieved without complicated control techniques.

Following the deposition of the layer 19, a thin electrically conducting film 21 is deposited on the surface of the substrate 3 of the FIG. 4(a) which was formerly covered by the layer 1. The film 21 may be a Nickel-iron (Ni—Fe) alloy, deposited on the substrate 3 by a vacuum process.

Figure 5:
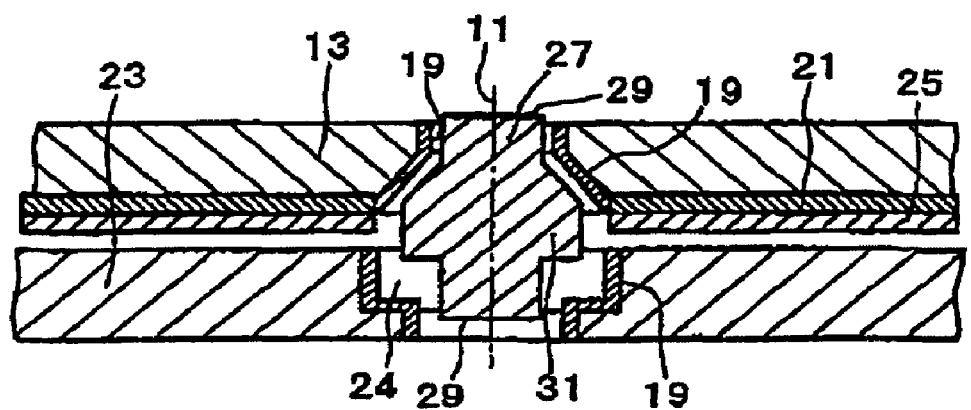
FIG. 5 shows the two substrates of FIG. 2 in an assembled configuration.

The substrates 13, 23 are positioned as shown in FIG. 5, with the openings 7, 15 facing each other, so that they together define a chamber 24. A shaft 27 is positioned between the substrate 3. The shaft 27 is circularly symmetric about an axis which is made to coincide with the axis 11. The shaft 27 includes two relatively narrow portions 29 at each end, and a relatively wide portion 31 between them. The wide portion 31 is located within the chamber 24 formed between the substrates 13, 23. The shaft 27 may be fabricated from a hard rod, such as steel or titanium, by a conventional grinding process, and then preferably polished to achieve surface smoothness. Optionally, a DLC film of high mechanical hardness is coated over essentially the entire outer surface of the shaft 27 to reduce friction at the contact surfaces of the shaft 27 which are to contact the contact surfaces of the substrates 13, 23. This DLC layer (not shown in FIG. 5) can be formed using a conventional deposition technique.

To precisely align the openings 7, 15 a position microscopic alignment method is used, preferably using appropriate alignment markers. The substrates 13, 23 are then heated to cause fusion between them at their interface. Optionally, a thin Pyrex glass adhesion layer 25 may be provided on one or other of the contact surfaces of the substrates 3 to promote the fusion electrically. The details of a suitable bonding technique are available in several publications related to semiconductor fabrication processes, such as "Semiconductor wafer bonding: science and technology", Q.-Y. Tong and U. Gosele, John Wiley, 1999. As described there, a low-powered electrical voltage is typically applied to the substrate 23 using a conductor probe, so that molecular attractions occur on the interface between the substrate 23 and the adhesion layer 25, thus bonding them together. Such a bonding process can be applied to substrates of various materials, and other adhesion layers 25, such as gold or polymer layers, may be used depending upon the process requirements. Note that the contact surfaces of the substrates 13, 23 and the layer 25 should be thoroughly cleansed or polished before the joining in order to provide a high quality article-free surface contact in order to give adhesion consistency.

Due to the electrically insulating DLC layer 19, the process of bonding the substrates 13, 23 to each other will not cause the shaft 27 to be attached to either of the substrates 13, 23, since no adhesion layer is formed on any of its surfaces. Hence, there is no additional step required to isolate the shaft 27 from the substrates 13, 23 during the bonding process. The adhesion only takes place at the interface between the substrates 13, 23, so that the shaft 27 is at all times free to rotate.

Note that once the substrates 13, 23 are bonded together, the wide portion 31 of the shaft 27 is permanently trapped inside the chamber 24 formed between the substrates 13, 23. FIG. 5 illustrates only a portion of the joined substrates 13, 23, and it is to be understood that the joined substrates 21, 23 comprise a plurality of chambers 24, each having a respective shaft 27 within it.

Figure 6:
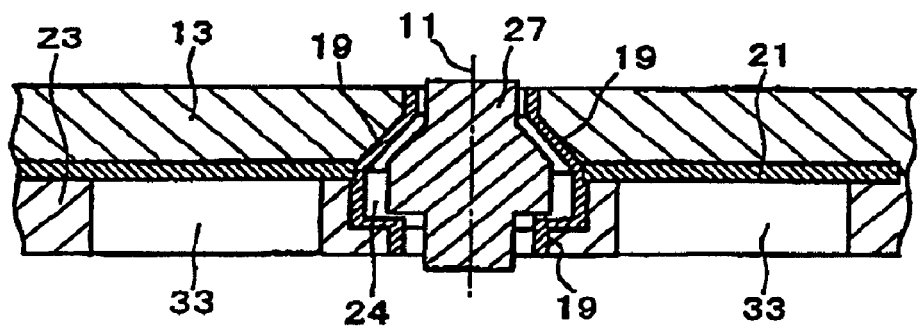
FIG. 6 shows the assembly of FIG. 5 after cavities have been formed in it.

In the next process step, as illustrated in FIG. 6, plasma etching is carried out to create circular cavities 33 extending throughout the entire thickness of the substrate 23 (i.e. about half of the total thickness of the combination of substrates 13, 23). The Ni—Fe seed layer 21 is then exposed in these cavities. The cavities 33 are formed by an etching process using a photo-resistant mark formed by lithography. This means that the cavities 33 have straight-walled trenches. By appropriate control of the speed and velocity of the particles used in the etching process, the etch profile can be achieved precisely. The cavities 33 have a circular profile (as viewed from the side of the assembly which is lower most in FIG. 6) and there is one cavity per shaft encircling the shaft. FIG. 6 shows the two opposing sides of this cavity 33.

Figure 7:
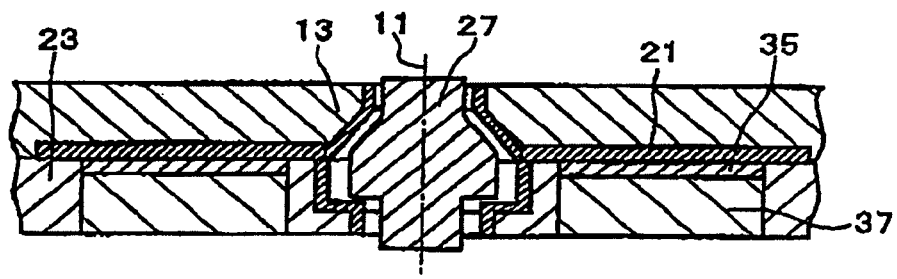
FIG. 7 shows the assembly of FIG. 6 with the addition of magnetic material.

To intensify the induced electromagnetic force, a thin layer 35 of material with high magnetic saturation properties, such as Nickel-Iron (Ni—Fe) is coated onto the innermost surface of the cavities 33 using an appropriate electro-plating technique. Such a method operates by applying electrical charges to draw metallic irons from a mixture solution containing the ingredients and using layer 21 as an electrode. The metal layer 35 shown in FIG. 7 functions as a yoke, which improves the magnetic flux linkage. The layer 35 is then covered by a magnetic material 37 which fills the cavities 33. Suitable materials 37 comprise ceramic or ferrite-composite, for example Cobalt-Phosphor composite (Co—P—X) which generates an intense magnetic field and has high resistance to de-magnetization. One suitable method for producing the layer 35 is electro-plating, which allows thickness of the layer 35 to be controlled uniformly and accurately. Once this deposition has been completed, the electrically conductive seed layer 21 is used to attract and accumulate metallic irons to fill the cavities 33, covering the yoke layer 25. Alternatively, a faster way of filling the cavities 33 is to use a screen-printing method to introduce a cream-like magnetic paste 37 into the cavities 33. The magnetic layers 35, 37 are then magnetized using external coils.

Figure 8:
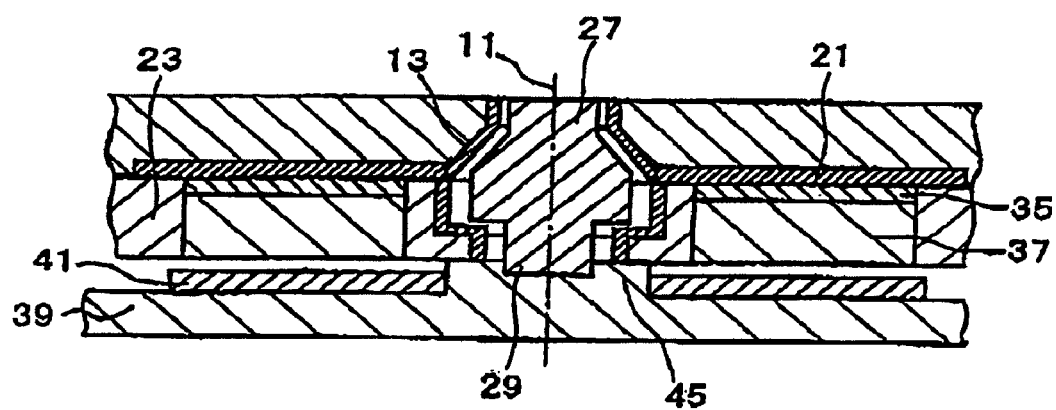
FIG. 8 shows the assembly of FIG. 7 after a stator has been connected to it.

The shaft 27 is then attached to a substrate 39 which will later be divided into stators 43, each of which surround the axis 11 of a respective shaft 27. The structure of the substrate 39 is shown in cross section in FIG. 8. Mainly it is a uniformly thin Si substrate, but it includes circular raised portions 45 for each respective shaft 27. Each raised portion 45 is surrounded by copper windings 41 formed by a conventional plating process as a thin layer on the surface of the Si substrate. The copper windings 41 provide the electrical conductors for the induced driving force of a brushless motor. The raised portions 45 are attached to the respective shafts 27. For this purpose, the contact surfaces of the shafts 27 which meet the raised portions 45 are coated with a thin adhesion layer, such as glass, by a vacuum deposition process in order to facilitate the bonding. Likewise, the previously mentioned electrical bonding method is again utilised by inserting the narrow ends 29 of the respective shafts 27 into respective etched circular depressions in the respective raised portions 45. In this position, the radially outermost section of the raised portion 45 contacts a portion of the substrate 23.

Figure 9:
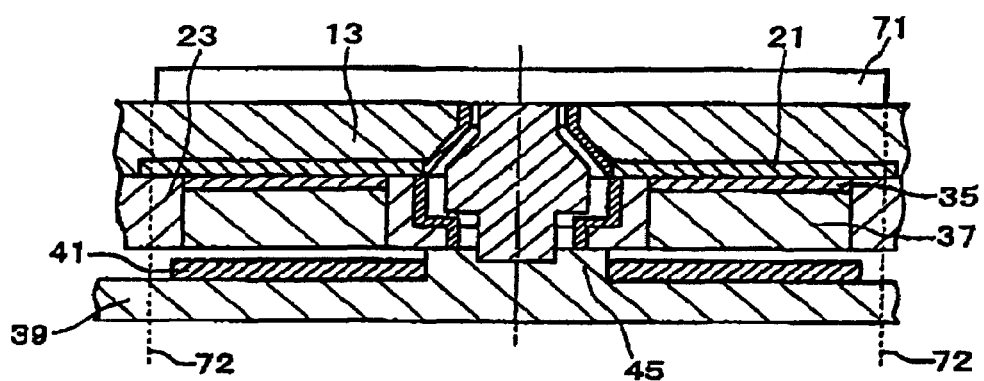
FIG. 9 shows an operation of cutting the substrates.
Figure 10:
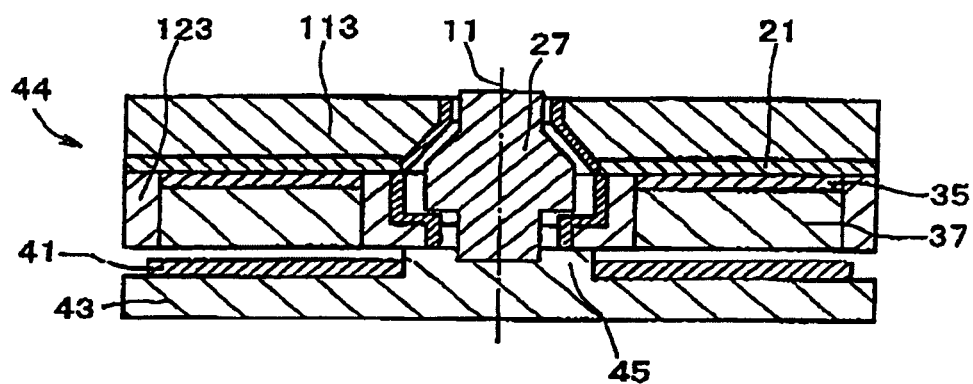
FIG. 10 shows the result of the cutting operation of FIG. 9 which is a MEMS device which is a first embodiment of the invention.

At this point, the substrates 13, 23 and 39 are partitioned along vertical lines 72 indicated in FIG. 9 to form individual motors. This is done by depositing a mask 71 onto the upper surface of the substrate 13, and then applying a dry etching process. The completed motor device is shown in FIG. 10 comprising a rotor 44 made up of joined sections 113, 123 (derived respectively from the substrates 13, 23) and a stator 43 (obtained from the substrate 39). The orientation of the MEMS device in FIG. 10 is the same orientation in which the MEMS device is used, i.e. with the axis 11 vertical and the rotor 44 above the stator 45.

Note that structures resembling what is shown in FIG. 10 are known, but only for non-MEMS devices which have completely different fabrication techniques. Using conventional MEMS technology, in which components are formed by sectioning wafers, it was very difficult and costly to produce a structure as shown in FIG. 10 prior to the present invention.

Figure 11:
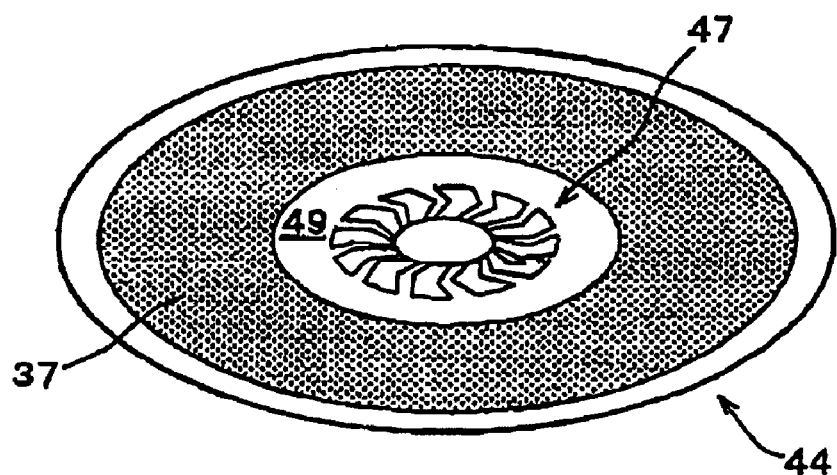
FIG. 11 shows the rotor of the embodiment of FIG. 10.
Figure 12:
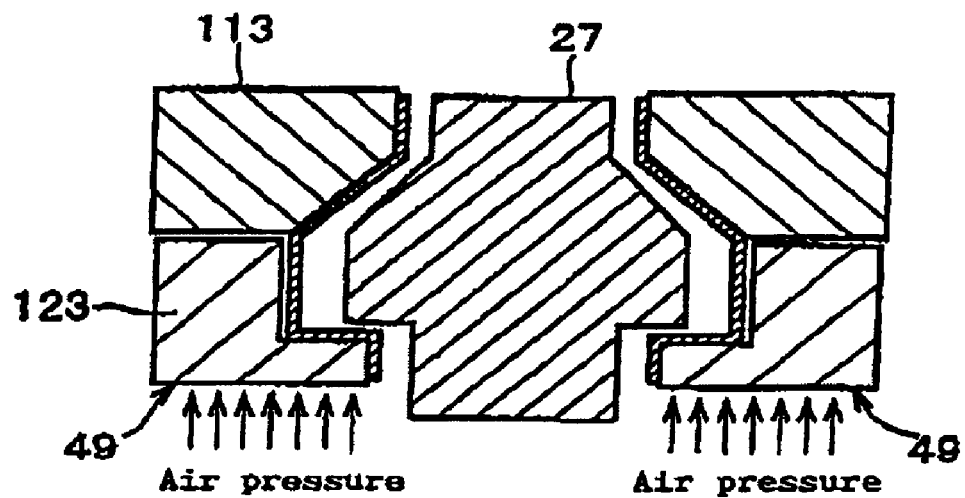
FIG. 12 shows the effect of an air bearing between the stator and the rotor in the embodiment of FIG. 10.

FIG. 11 is a view of the rotor 44 in an upper perspective view. Note that of course it is impossible to obtain this view once the stator 43 is attached to the shaft 27. Before the raised portion 45 of the stator 43 was attached to the respective shaft 27, a circular pattern of (V-shaped) grooves 47 was formed in the lower surface of the rotor 44 surrounding the chamber 24 by a dry etching process. When the rotor 44 rotates, these grooves generate a positive air pressure (i.e. a pressure of more than 1 atmosphere) on the under surface 49 of the rotor 44 near the raised portion 45 of the stator 43. This air pressure pushes the rotor 44 away from the stator 43 to prevent frictional contact between the raised portion 45 of the stator 43 and the rotor 44, as shown in FIG. 12.

Figure 13:
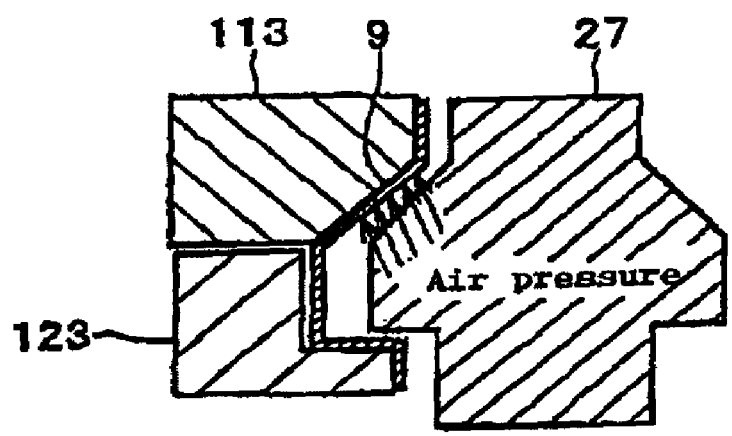
FIG. 13 shows the effect of a first air bearing between the shaft and the rotor in the embodiment of FIG. 10.

Additionally, an air flow is generated between the shaft 27 and the rotor 4. As shown on FIG. 13, the air pressure above the conical surface of the shaft 27 pushes upwardly on the contact surface 9 of the stator portion 113. This air pressure pushes the rotor 44 up, and thus helps to "float" the rotor above the stator surface. If the shaft 27 approaches the rotor surface 9, the pressure increases to urge them apart. Therefore, contact resistance between the shaft 27 and the contact surface 9 is reduced, or perhaps even eliminated.

Figure 14A:
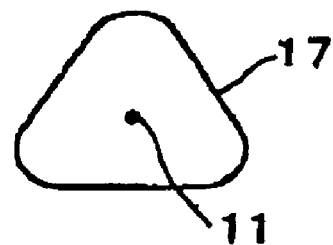
FIGS. 14(a)–(c) shows the effect of a second air bearing between the shaft and the rotor in an alternate embodiment of the invention.
Figure 14B:
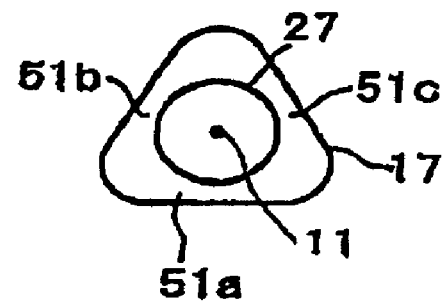
Figure 14C:
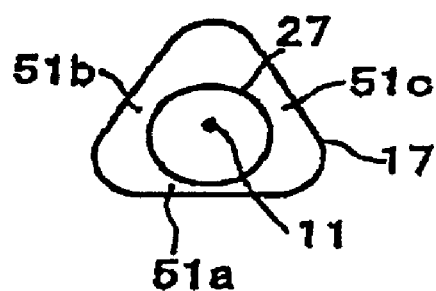

Turning to a second embodiment of the invention, the construction of this embodiment is very largely identical to that of the first embodiment, except that in this embodiment the holes 17 in the substrate 13 and/or the substrate 23 of FIG. 4(a) are not circular, but instead have a shape (as viewed parallel to the axis 11) having a triangular symmetry, and formed from three arcs. This is illustrated in FIG. 14(a), which shows a hole 17 viewed parallel to the axis 11. FIG. 14(b) shows a view again, looking along axis 11, of a narrow circular-cylindrical portion 29 of the shaft 27 located within the holes 17 in this embodiment. The co-operating shapes of the hole 17 and the portion 29 of the shaft mean that there are three constrictions 51a, 51b, 51c symmetrically arranged at uniform angular intervals around the axis 11. At each of these locations, the air pressure is higher, and urges the rotor 44 away from the shaft 27. When the centre 11 of the hole 17 is aligned with the axis of the shaft (as shown in FIG. 14(b)), these forces balance each other, and there is no net force on the device in the horizontal (rotational) plane. However, if the centre 11 of the triangle 17 moves away from the axis of the shaft (as shown in FIG. 14(c)) the pressure at constriction 51a rises and at constrictions 51b, 51c falls, and so the net force urges the centre 11 of the rotor 44 back toward the axis of the shaft.

Although only two embodiments of the invention have been described, many variations are possible within the scope of the invention as will be clear to a skilled person. For example, in principle it would be possible to form the grooves (which generate the area of increased air pressure) on the curved surface of the shaft. However, practically speaking it is difficult to form grooves on the curved surfaced of the shaft, so this possibility is not recommended. Furthermore, it might be possible to form the grooves on the stator rather than on the rotor, but this will generally lead to a much reduced air pressure in the bearing.

In a further example, although the invention has been illustrated in the case that the motor is an electromagnetic motor, the invention is applicable also if the motor is an electrostatic motor.

The motor device proposed by the present invention can be implemented in applications such as a (micro)-gyroscope, a (micro-) HDD (hard disk drive), a (micro-)optical storage drive, a (micro-)lens actuator, a (micro-)pump, a (micro-)fan, etc. In designs according to the invention the shaft may have a thickness less than 2 mm (e.g. about 1 mm), the rotor may have a diameter less than 10 mm (e.g. about 8 mm) and a thickness of less than 2 mm (e.g. about 1 mm).

The invention claimed is:

1. A MEMS device including a rotor including an aperture, a shaft extending through the aperture, and a stator attached to the shaft, the device including one or more grooves located to form at least one air bearing between the rotor and at least one of the stator and the shaft upon rotation of the rotor around the shaft;

said one or more grooves generating an air flow in a gap between the rotor and the shaft forming said air bearing;

said shaft including a frustoconical section opposing a frustoconical surface of the rotor, wherein the air bearing is formed between the frustoconical section and the frustoconical surface upon rotation of the rotor, said frustoconical surface of the shaft being formed on a wide portion of the shaft located within a chamber included in a substrate, said rotor including two joined substrates defining said chamber between them;

said two substrates of the rotor sandwiching a metal layer.

2. A device according to claim 1 in which at least some of the grooves are formed on the rotor surrounding the aperture, to generate a positive pressure between the rotor and the stator to urge the rotor and the stator apart.

3. A device according to claim 1 in which the gap between the rotor and the shaft includes at least three circumferentially spaced constrictions, whereby air bearings are generated at the constrictions upon rotation of the rotor and urge a central axis of the rotor towards a rotational axis of the shaft.

4. A device according to claim 1 in which the rotor includes recesses facing the stator and including yoke material and magnetic material, the stator having a surface including conductive loops.

5. A device according to claim 1 which is used in a gyroscope, a HDD motor, a DVD motor, a zoom lens motor, a pump, or a fan.

* * * * *